(12) United States Patent
Kim et al.

(10) Patent No.: US 12,557,472 B2
(45) Date of Patent: Feb. 17, 2026

(54) DISPLAY APPARATUS HAVING IMPROVED LIGHT EFFICIENCY

(71) Applicant: LG DISPLAY CO., LTD., Seoul (KR)

(72) Inventors: Ho-Jin Kim, Paju-si (KR); Han-Sun Park, Paju-si (KR); Pu-Reum Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 576 days.

(21) Appl. No.: 17/977,409

(22) Filed: Oct. 31, 2022

(65) Prior Publication Data

US 2023/0209898 A1 Jun. 29, 2023

(30) Foreign Application Priority Data

Dec. 29, 2021 (KR) .................. 10-2021-0191085

(51) Int. Cl.
*H10K 50/844* (2023.01)
*H10D 86/40* (2025.01)
*H10D 86/60* (2025.01)
*H10K 50/856* (2023.01)
*H10K 59/121* (2023.01)
*H10K 59/35* (2023.01)
*H10K 59/38* (2023.01)

(52) U.S. Cl.
CPC .......... *H10K 50/844* (2023.02); *H10D 86/40* (2025.01); *H10D 86/60* (2025.01); *H10K 50/856* (2023.02); *H10K 59/1213* (2023.02); *H10K 59/35* (2023.02); *H10K 59/38* (2023.02)

(58) Field of Classification Search
CPC ..... H10K 59/1213; H10K 59/35; H10K 59/38
USPC .......................................................... 257/40
See application file for complete search history.

(56) References Cited

U.S. PATENT DOCUMENTS

2022/0302229 A1\* 9/2022 Yue .................. H10K 59/38

FOREIGN PATENT DOCUMENTS

| KR | 10-0453364 B1 | 10/2004 |
| KR | 20090065104 A | 6/2009 |
| KR | 20170092164 A | 8/2017 |

OTHER PUBLICATIONS

Office Action in Korean Appln. No. 10-2021-0191085, mailed on Aug. 16, 2025, 14 pages (with English translation).

\* cited by examiner

*Primary Examiner* — Xia L Cross
(74) *Attorney, Agent, or Firm* — Fish & Richardson P.C.

(57) ABSTRACT

A display apparatus includes a substrate including a plurality of sub-pixels; a transistor formed in each of the plurality of sub-pixels; an organic light emitting element formed in each of the plurality of sub-pixels; an encapsulation layer formed on the organic light emitting element; a reflective member disposed in a boundary region between the plurality of sub-pixels and formed inside the encapsulation layer; and a color filter layer disposed on the encapsulation layer.

19 Claims, 15 Drawing Sheets

DISPLAY APPARATUS HAVING IMPROVED LIGHT EFFICIENCY

CROSS-REFERENCE TO RELATED APPLICATION

The present application claims the priority of Korean Patent Application No. 10-2021-0191085 filed on Dec. 29, 2021, which is hereby incorporated by reference in its entirety.

BACKGROUND

Field of the Disclosure

The present disclosure relates to a high-resolution display apparatus with an improved light efficiency.

Discussion of the Related Art

Recently, with a development of multimedia, an importance of a flat display apparatus has been increased. In response to this, flat display apparatuses such as a liquid crystal display apparatus, a plasma display apparatus, and an organic electroluminescent display apparatus have been commercialized. Among these flat display apparatuses, the organic electroluminescent display apparatus is currently widely used in that it has a high response speed, a high luminance and a good viewing angle.

Meanwhile, as virtual reality and augmented reality attract a lot of attention in recent years, a demand for a compact display apparatus with a high resolution that can implement them is increasing. However, it is difficult to satisfy such high resolution and compactness with the related art organic electroluminescent display apparatus.

SUMMARY

Accordingly, the present disclosure is directed to a display apparatus that substantially obviates one or more of the problems due to limitations and disadvantages described above.

An advantage of the present disclosure is to provide a display apparatus which can realize a high resolution and improve a light efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display apparatus includes a substrate including a plurality of sub-pixels; a transistor formed in each of the plurality of sub-pixels; an organic light emitting element formed in each of the plurality of sub-pixels; an encapsulation layer formed on the organic light emitting element; a reflective member disposed in a boundary region between the plurality of sub-pixels and formed inside the encapsulation layer; and a color filter layer disposed on the encapsulation layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

Figure 1:
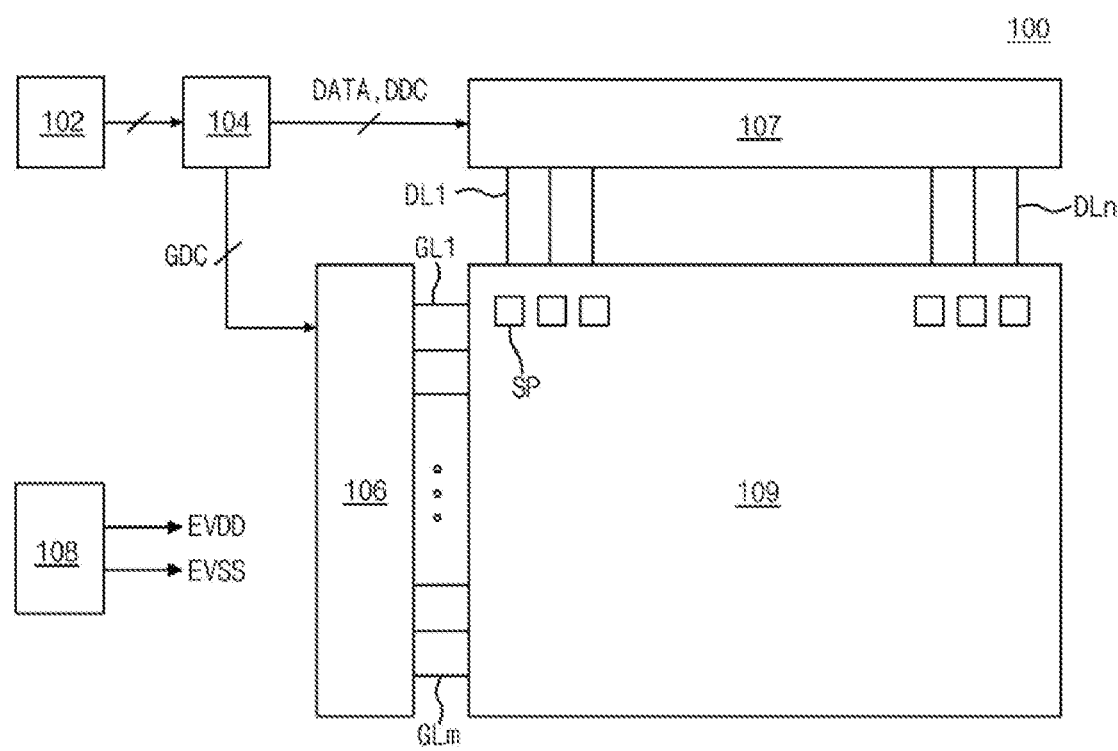
FIG. 1 is a schematic block diagram of an organic electroluminescent display apparatus according to the present disclosure.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the present disclosure to the skilled in the art of the present disclosure, and the present disclosure is only defined by the scope of the claims.

The shapes, sizes, proportions, angles, numbers, and the like disclosed in the drawings for explaining the aspects of the present disclosure are illustrative, and the present disclosure is not limited to the illustrated matters. The same reference numerals refer to the same components throughout the description. Furthermore, in describing the present disclosure, if it is determined that a detailed description of the related known technology unnecessarily obscure the subject matter of the present disclosure, the detailed description thereof can be omitted. When 'including', 'having', 'comprising', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'below', 'beside', and the like, one or more other parts may be positioned between two parts unless 'right' or 'directly' is used.

In the case of a description of a temporal relationship, for example, when a temporal precedence is described as 'after', 'following', 'next', 'before', and the like, cases that are not continuous may be included unless right' or 'directly' is used.

Although a first, a second and the like are used to describe various components, these components are not limited by these terms. These terms are only used to distinguish one component from another component. Therefore, a first component mentioned below may be a second component within the technical spirit of the present disclosure.

Respective features of various aspects of the present disclosure can be partially or wholly connected to or combined with each other and can be technically interlocked and driven variously, and respective aspects may be independently implemented from each other or may be implemented together with a related relationship.

Hereinafter, aspects according to the present disclosure are explained with reference to the drawings.

The present disclosure may be applied to various display apparatuses. For example, the present disclosure may be applied to various display apparatuses such as a liquid crystal display apparatus, an organic electroluminescent display apparatus, and an electrophoretic display apparatus. However, the organic electroluminescent display apparatus is described below for convenience of explanations.

Figure 2:
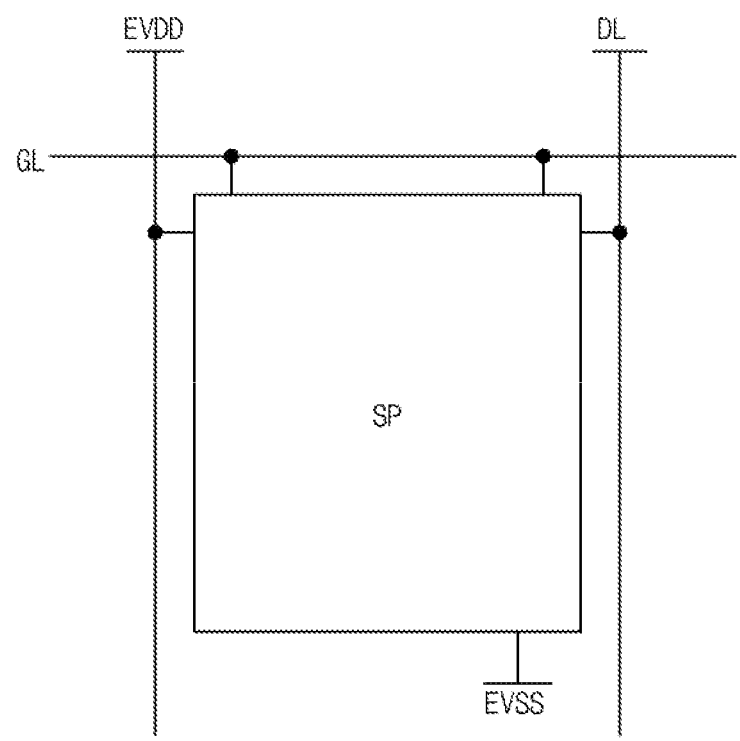
FIG. 2 is a schematic block diagram of a sub-pixel in FIG. 1.

FIG. 1 is a schematic block diagram of an organic electroluminescent display apparatus according to the present disclosure, and FIG. 2 is a schematic block diagram of a sub-pixel in FIG. 1.

As shown in FIG. 1, the organic electroluminescent display apparatus 100 may include an image processing portion 102, a timing control portion 104, a gate driving portion 106, a data driving portion 107, a power supply portion 108, and a display panel 109.

The image processing portion 102 may output driving signals for driving various devices together with image data supplied from an outside. For example, the driving signals output from the image processing portion 102 may include a data enable signal, a vertical synchronization signal, a horizontal synchronization signal, a clock signal, and the like.

The timing control portion 104 may receive the driving signals along with image data from the image processing portion 102. The timing control portion 104 may generate and output a gate timing control signal GDC for controlling an operation timing of the gate driving portion 106 and a data timing control signal DDC for controlling an operation timing of the data driving portion 107, based on the driving signals input from the image processing portion 102.

The gate driving portion 106 may output scan signals to the display panel 109 in response to the gate timing control signal GDC supplied from the timing control portion 104. The gate driving portion 106 may output the scan signals to the plurality of gate lines GL1 to GLm. In this case, the gate driving portion 106 may be configured in a form of an IC (Integrated Circuit), but is not limited thereto.

The data driving portion 107 may outputs data voltages to the display panel 109 in response to the data timing control signal DDC input from the timing control portion 104. The data driving portion 107 may sample and latch a digital data signal DATA supplied from the timing control portion 104 and convert it into an analog data voltage based on gamma voltages. The data driving portion 107 may outputs the data voltages to a plurality of data lines DL1 to DLn. In this case, the data driving portion 107 may be configured in a form of an IC (Integrated Circuit), but is not limited thereto.

The power supply portion 108 may output a high potential voltage VDD and a low potential voltage VSS and supply them to the display panel 109. The high potential voltage VDD may be supplied to the display panel 109 through a first power line EVDD, and the low potential voltage VSS may be supplied to the display panel 109 through a second power line EVSS. At this time, voltages output from the power supply portion 108 may be output to the gate driving portion 106 and/or the data driving portion 107 to be used for driving them.

The display panel 109 may display an image corresponding to the data voltage and the scan signal supplied from the gate driving portion 106 and the data driving portion 107, and the power supplied from the power supply portion 108.

The display panel 109 may include a plurality of sub-pixels SP to display an actual image. The sub-pixels SP may include a red sub-pixel, a green sub-pixel, and a blue sub-pixel, or a white sub-pixel, a red sub-pixel, a green sub-pixel and a blue sub-pixel. In this case, the white, red, green, and blue sub-pixels SP may all have the same area or may have different areas.

As shown in FIG. 2, one sub-pixel SP may be connected to the gate line GL, the data line DL, the first power line EVDD, and the second power line EVSS. A number of transistors and capacitors as well as a driving method of the sub-pixel SP may be determined according to a configuration of a pixel circuit.

Figure 3:
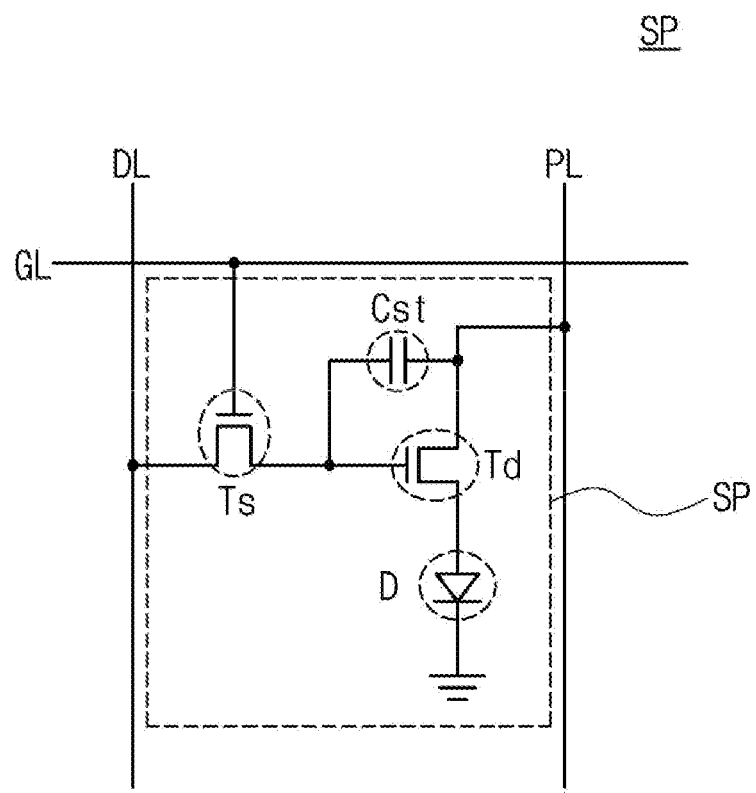
FIG. 3 is a circuit diagram conceptually illustrating a sub-pixel of the organic electroluminescent display apparatus according to the present disclosure.

FIG. 3 is a circuit diagram conceptually illustrating a sub-pixel of the organic electroluminescent display apparatus according to the present disclosure.

As shown in FIG. 3, the organic electroluminescent display apparatus according to the present disclosure may include a gate line GL, a data line DL, and a power line PL that cross each other and define a sub-pixel SP. A switching transistor Ts, a driving transistor Td, a storage capacitor Cst, and an organic light emitting element D may be disposed in the sub-pixel SP.

The switching transistor Ts may be connected to the gate line GL and the data line DL, and the driving transistor Td and the storage capacitor Cst may be connected between the switching transistor Ts and the power line PL. The organic light emitting element D may be connected to the driving transistor Td.

In the organic electroluminescent display apparatus having such the structure, when the switching transistor Ts is turned on according to the gate signal applied to the gate line GL, the data signal applied to the data line DL is switched to be applied to the gate electrode of the driving transistor Td and one electrode of the storage capacitor Cst through the switching transistor Ts.

The driving transistor Td is turned on according to the data signal applied to the gate electrode thereof, and as a result, a current proportional to the data signal flows from the power line PL to the organic light emitting element D through the driving transistor Td. Thus, the organic light emitting element D emits a light with a luminance proportional to the current flowing through the driving transistor Td.

At this time, the storage capacitor Cst is charged with a voltage proportional to the data signal, so that the voltage of the gate electrode of the driving transistor Td is constantly maintained for one frame.

Although only two transistors Td and Ts and one capacitor Cst are shown in the drawing, the present disclosure is not limited thereto, and three or more transistors and two or more capacitors may be provided.

Figure 4:
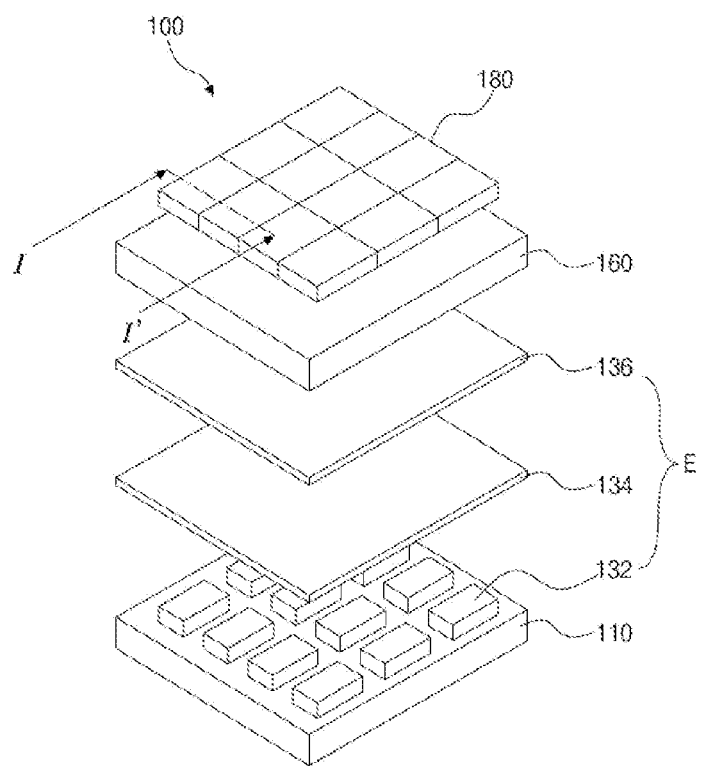
FIG. 4 is a perspective view schematically illustrating a structure of an organic electroluminescent display apparatus according to a first aspect of the present disclosure.

FIG. 4 is a perspective view schematically illustrating a structure of an organic electroluminescent display apparatus according to a first aspect of the present disclosure.

The organic electroluminescent display apparatus 100 according to the present disclosure may be applied to various structures. Hereinafter, a so-called OLEDoS (Organic Light Emitting Diode on Silicon) structure in which an organic light emitting element is formed on a silicon wafer substrate using a semiconductor process is explained. However, the present disclosure is not limited to the organic electroluminescent display apparatus 100 having such the structure.

As shown in FIG. 4, the organic electroluminescent display apparatus 100 according to the first aspect of the present disclosure may include a wafer substrate 110, a first electrode 132, an organic light emitting layer 134, a second electrode 136, an encapsulation layer 160 and a color filter layer 180.

The wafer substrate 110 may be a silicon wafer substrate formed using a semiconductor process. An active layer may be formed inside the wafer substrate 110, and a gate line, a data line, and a transistor may be disposed on the wafer substrate 110.

The first electrode 132, the organic light emitting layer 134, and the second electrode 136 are sequentially formed to form the organic light emitting element E. In the first electrode 132, a plurality of red sub-pixels, green sub-pixels, and blue sub-pixels may have respective first electrodes 132 which are arranged on the wafer substrate 110 to be spaced apart from each other at a predetermined interval.

The organic light emitting layer 134 may be formed over the entire wafer substrate 110 to cover the wafer substrate 110 and the first electrodes 132. The organic light emitting layer 134 may be formed in common for all red, green, and blue sub-pixels to emit a white light from these sub-pixels.

The second electrode 136 may be formed on the organic light emitting layer 134. The second electrode 136 may be formed over all sub-pixels so that a signal is applied to all sub-pixels at the same time.

The encapsulation layer 160 may be formed on the second electrode 136 to prevent oxygen or moisture from penetrating into the organic light emitting element E. The encapsulation layer 160 may be configured with a plurality of layers of an inorganic layer and an organic layer.

The color filter layer 180 may be formed on the encapsulation layer 160. The color filter layer 180 may include a red color filter, a green color filter, and a blue color filter.

In the organic electroluminescent display apparatus 100 having the OLEDoS structure, since the active layer is formed in the wafer substrate 110 to form a transistor, a single crystal transistor having an excellent electrical mobility can be formed. Accordingly, it is possible to significantly reduce a size of the sub-pixel, thereby manufacturing a high-resolution display apparatus.

In addition, in the organic electroluminescent display apparatus 100 having the OLEDoS structure, not only the transistors in the sub-pixel but also transistors of the gate driving portion and the data driving portion can be formed of single crystal transistors, so that a fast response speed can be obtained.

The organic electroluminescent display apparatus 100 of the OLEDoS structure can be applied to various fields. For example, the organic electroluminescent display apparatus 100 of the OLEDoS structure can be applied to a metaverse device that represents a virtual world based on virtual reality (VR) and augmented reality (AR) which have recently been in the spotlight.

Figure 5:
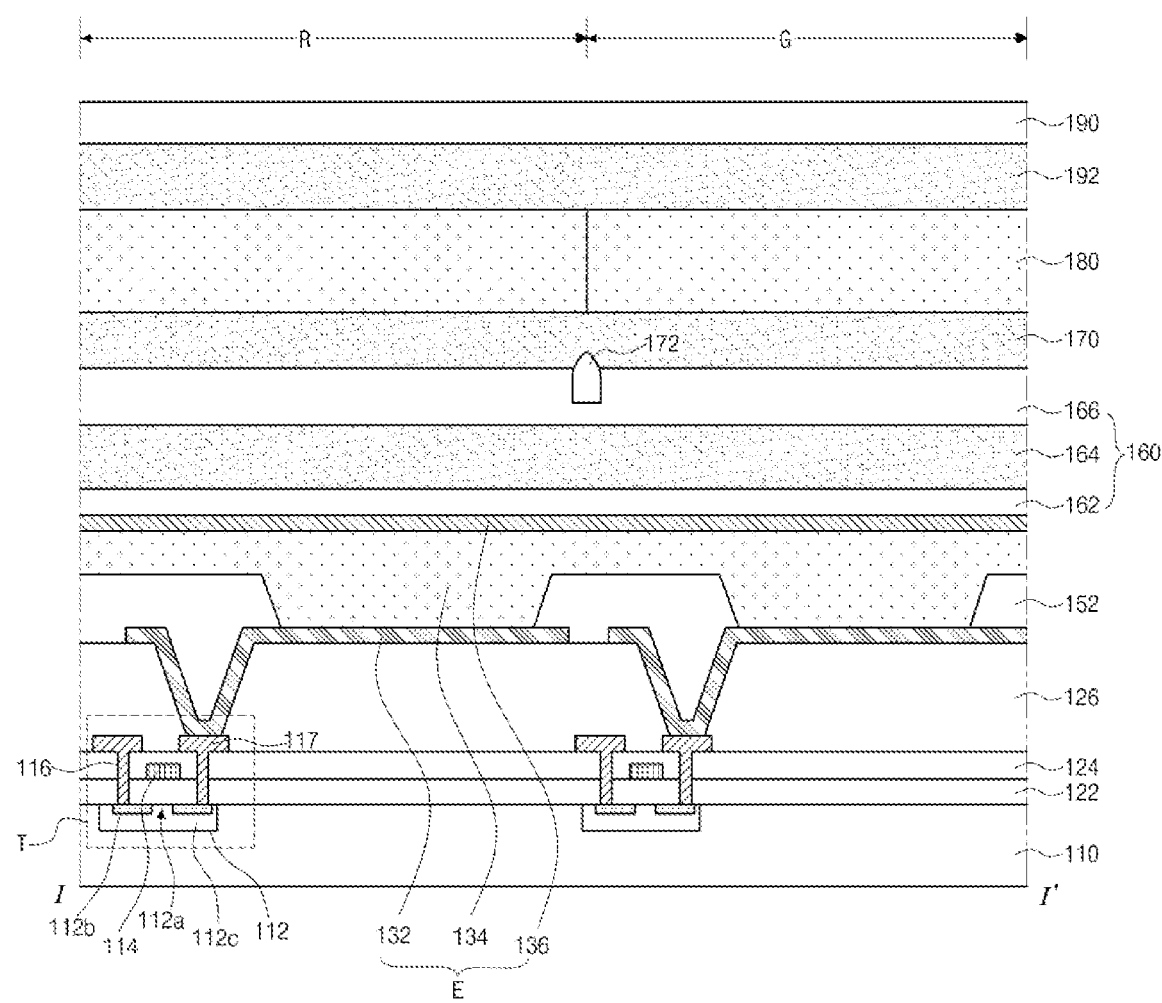
FIG. 5 is a cross-sectional view showing a structure of an organic electroluminescent display apparatus according to the first aspect of the present disclosure.

FIG. 5 is a cross-sectional view, taken along a line I-I' of FIG. 4, showing a specific structure of an organic electroluminescent display apparatus according to the first aspect of the present disclosure. Although the organic electroluminescent display apparatus 100 includes red (R), green (G), and blue (B) sub-pixels, only the R sub-pixel and the G sub-pixel adjacent to each other is described below for convenience of explanations.

As shown in FIG. 5, in the organic electroluminescent display apparatus 100 according to the first aspect of the present disclosure, a transistor T may be disposed on a wafer substrate 110 of each of the sub-pixels R and G.

The transistor T may include an active region 112 disposed inside the wafer substrate 110, a gate insulating layer 122 formed on a top surface of the wafer substrate 110, a gate electrode 114 disposed on the gate insulating layer 122, a first inter-layered insulating layer 124 formed on the gate insulating layer 122 and the gate electrode 114, and a source electrode 116 and a drain electrode 117 disposed on the first inter-layered insulating layer 124.

The wafer substrate 110 may be a single crystal silicon wafer formed by growing single crystal silicon (Si), but is not limited thereto, and may be a wafer made of various semiconductor materials.

The active region 112 may be formed in the wafer substrate 110. A portion of the active region 112 of the wafer substrate 110 may be doped with impurities inside the wafer substrate 110, so that the active region 112 may include a central channel region 112a undoped with impurities, and a source region 112b and a drain region 112c located at both sides of the channel region 112a and doped with impurities.

The gate insulating layer 122 may be formed of a single layer or a plurality of layers made of an inorganic material(s) such as SiOx and SiNx, but is not limited thereto.

The gate electrode 114 may be formed of a single layer or a plurality of layers made of a metal(s) such as Cr, Mo, Ta, Cu, Ti, Al, and an Al alloy, but is not limited thereto.

The first inter-layered insulating layer 124 may be formed of a single layer or a plurality of layers made of an inorganic material(s) such as SiNx and SiOx, or may be formed of an organic material such as photoacrylic. In addition, the first inter-layered insulating layer 124 may be configured with a plurality of layers of an organic material layer and an inorganic material layer.

The source electrode 116 and the drain electrode 117 may be formed of a single layer or a plurality of layers made of a metal(s) such as Cr, Mo, Ta, Cu, Ti, Al, and an Al alloy, but is limited thereto.

The source electrode 116 and the drain electrode 117 may be respectively in ohmic contact with the source region 112b and the drain region 112c of the active region 112 through contact holes formed in the gate insulating layer 122 and the first inter-layered insulating layer 124.

A passivation layer 126 may be formed on the wafer substrate 110 on which the transistor T is formed. The passivation layer 126 may be made of an organic material such as photoacrylic, but is not limited thereto.

A bank layer 152 may be formed at a boundary of each sub-pixel on the passivation layer 126. The bank layer 152 may be a separation wall defining the sub-pixel. The bank layer 152 may partition the sub-pixels to prevent a light of a specific color output from an adjacent sub-pixel from being mixed and output.

An organic light emitting element E may be formed on the passivation layer 126 and may be connected to the drain electrode 117 of the transistor T through a contact hole formed in the passivation layer 126.

The organic light emitting element E may include a first electrode 132 formed between the bank layers 152 and connected to the drain electrode 117 of the transistor T through the contact hole, an organic light emitting layer 134 formed on the first electrode 132 and the bank layer 152, and a second electrode 136 formed on the organic light emitting layer 134.

The first electrode 132 may be formed of a single layer or a plurality of layers made of a metal(s) such as Ca, Ba, Mg, Al, Ag, and/or an alloy thereof, or may be formed of a transparent metal oxide such as indium tin oxide (ITO) and indium zinc oxide (IZO). The first electrode 132 may be connected to the drain electrode 117 of the transistor T. The first electrode 132 may be made of a transparent metal oxide such as indium tin oxide (ITO), indium zinc oxide (IZO), and metal having a good electrical conductivity.

When the first electrode 132 is made of a transparent metal oxide, although not shown in the drawing, a reflective electrode with a good reflectance such as Al or Ag may be formed below the first electrode 132 to reflect a light incident on the first electrode 132, thereby improving a light efficiency.

The first electrode 132 may be formed for each sub-pixel. Both ends of the first electrode 132 may be covered by the bank layer 152.

The organic light emitting layer 134 may be formed on the first electrode 132 and the bank layer 152. The organic light emitting layer 134 may include at least one of a hole transporting layer, a hole injecting layer, a light emitting layer, an electron transporting layer, and an electron injecting layer.

The organic light emitting layer 134 may be a white organic light emitting layer emitting a white light and formed substantially over the entire display apparatus 100. The organic light emitting layer 134 may be formed with two or more stacks in a tandem structure. Each of the stacks may include a hole transporting layer, a light emitting layer, and an electron transporting layer.

The light emitting layer may include a plurality of light emitting layers stacked in a tandem structure. For example, the light emitting layer may include a red (R) light emitting layer, a green (G) light emitting layer, and a blue (B) light emitting layer stacked in a tandem structure, so that a red light, a green light, and a blue light output from the respective light emitting layers may be mixed to output a white light. In this case, a hole transporting layer, an electron transport layer, and a charge generation layer may be disposed between such the light emitting layers in the tandem structure.

In addition, the light emitting layer may include a yellow-green light emitting layer and a blue (B) light emitting layer stacked in a tandem structure, so that a yellow-green light and a blue light emitted from the respective light emitting layers may be mixed to output a white light.

In the organic electroluminescent display apparatus 100 according to the first aspect of the present disclosure, a structure of the light emitting layer to output a white light is not limited to the above structure, but may have various structures. The organic light emitting layer 134 may be formed over the entire wafer substrate 110 by a deposition process or a solution process.

The second electrode 136 may be made of a transparent conductive material such as indium tin oxide (ITO), indium zinc oxide (IZO) and a thin metal which can transmit a visible light, but is not limited thereto.

When voltages are applied to the first electrode 132 and the second electrode 136 in the organic light emitting element E, holes and electrons move to the light emitting layer through the hole transporting layer and the electron transporting layer, respectively, and are combined with each other in the light emitting layer to emit a light.

An encapsulation layer 160 may be formed on the second electrode 136. The encapsulation layer 160 may include a first encapsulation layer 162 made of an inorganic material, a second encapsulation layer 164 made of an organic material, and a third encapsulation layer 166 made of an inorganic material. In this case, the inorganic material may include, but is not limited to, SiNx and SiOx. In addition, the organic material may include, but is not limited to, polyethylene terephthalate, polyethylene naphthalate, polycarbonate, polyimide, polyethylene sulfonate, polyoxymethylene, polyarylate, or a mixture thereof.

However, in the organic electroluminescent display apparatus 100 according to the first aspect of the present disclosure, the encapsulation layer 160 is not limited to the triple-layered structure as described above, but may be formed in various structures. For example, the encapsulation layer 160 may have a double-layered structure of an inorganic layer and an organic layer, or may have a structure of four or more layers.

A second inter-layered insulating layer 170 may be formed on the encapsulation layer 160. The second inter-layered insulating layer 170 may be formed of an inorganic material such as SiOx, SiNx, and SiON.

An air layer 172 may be formed in the third encapsulation layer 166 and extend into the second inter-layered insulating layer 170 in a boundary region between the sub-pixels. Since the air layer 172 is formed in the boundary region between the sub-pixels, the air layer 172 and the bank layer 152 may overlap each other in a direction perpendicular to the substrate 110. The air layer 172 may serve as a reflective member for reflecting a light propagating through the third encapsulation layer 166 and the second inter-layered insulating layer 170. The reflective member may be disposed at a position overlapping the bank layer 152. That is, an air has a refractive index of about 1.0, whereas the material forming the third encapsulation layer 166 and the second inter-layered insulating layer 170, for example, SiOx has a refractive index of about 1.45, SiNx has a refractive index of about 1.5, and SiON has a refractive index of about 1.4 to 1.8.

Accordingly, due to a difference in refractive index between the air layer 172, and the third encapsulation layer 166 and the second inter-layered insulating layer 170, when a light propagating through the third encapsulation layer 166 and the second interlayer insulating layer 170 is incident on the air layer 172, the light is refracted. In particular, when a light propagating through the third encapsulation layer 166 and the inter-layered insulating layer 170 is incident on the air layer 172 at an angle greater than a threshold value, the light is totally reflected at an interface of the air layer 172.

Meanwhile, when the encapsulation layer 160 is configured with only the first encapsulation layer 162 made of an inorganic material and the second encapsulation layer 164 made of an organic material, the air layer 172 may be formed in the second encapsulation layer 164 and the inter-layered insulating layer 170. Since a refractive index of the organic material forming the second encapsulation layer 164 is about 2.0 or more, even in this structure, most of a light which is propagate through the second encapsulation layer 164 and the second interlayer insulating layer 170 and then is incident on the interface of the air layer 172 is totally reflected.

Although described in detail later, in the organic electroluminescent display apparatus 100 according to the first aspect of the present disclosure, when a light emitted from a specific sub-pixel is incident on a boundary region with an adjacent sub-pixel, the light is totally reflected by the air layer 172 and output through the specific sub-pixel. Thus, it is possible to prevent the light emitted from the corresponding sub-pixel from being output through the adjacent sub-pixel and to improve the intensity of the light output from the corresponding sub-pixel.

A color filter layer 180 may be formed on the second inter-layered insulating layer 170. The color filter layer 180 may include an R color filter, a G color filter, and a B color filter respectively formed in the R sub-pixel, the G sub-pixel, and the B sub-pixel.

The R color filter may serve to output only a red light by absorbing a light of a wavelength band other than the red light while passing through the R color filter for a white light emitted from the organic light emitting element E. The G color filter may serve to output only a green light by absorbing a light of a wavelength band other than the green light while passing through the G color filter for a white light emitted from the organic light emitting element E. The B color filter may serve to output only a blue light by absorbing a light of a wavelength band other than the blue light while passing through the B color filter for a white light emitted from the organic light emitting element E.

Although not shown in the drawings, an inorganic layer such as AlOx may be formed on the second inter-layered insulating layer 170, and an adhesive layer for improving adhesion with the color filter layer 180 may be formed.

An adhesive 192 may be disposed on the color filter layer 180, and a protective member 190 may be disposed on the adhesive 192, and the protective member 190 may be attached to the color filter layer 180 by the adhesive 192.

The protective member 190 may serve to protect and encapsulate the organic electroluminescent display apparatus 100, and may be formed of glass or a transparent film. As such the film, a transparent protective film such as a polystyrene (PS) film, a polyethylene (PE) film, a polyethylene naphthalate (PEN) film, or a polyimide (PI) film may be used.

The adhesive 192 may be a transparent optical adhesive (e.g., OCA (Optical Clear Adhesive)), but is not limited thereto, and various adhesive members may be used.

As described above, in the organic electroluminescent display apparatus 100 according to the first aspect of the present disclosure, since the transistor T is formed on the wafer substrate 110 made of a single crystal semiconductor rather than a glass or plastic film, even when the area of the sub-pixel is greatly reduced, a desired high-quality image can be expressed, thereby enabling a realization of the high-resolution display apparatus 100.

Furthermore, in the organic electroluminescent display apparatus 100 according to the first aspect of the present disclosure, since a black matrix for preventing a light leakage between the sub-pixels R and G is not formed, a finer sub-pixel can be formed. This makes it possible to realize the display apparatus 100 having a super high resolution.

In the organic electroluminescent display apparatus 100 according to the first aspect of the present disclosure, the air layer 172 is formed in the boundary region of the sub-pixel in the second inter-layered insulating layer 170 which is formed below the color filter layer 180, and this it is possible to improve a light efficiency of the R, G, and B sub-pixels, which is described in detail below.

Figure 6:
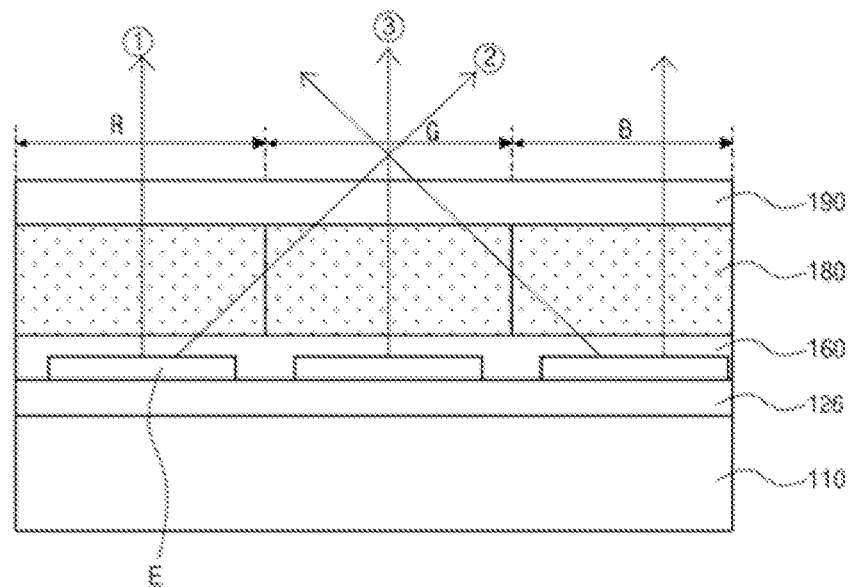
FIG. 6 is a view illustrating an output path of a light emitted from an organic light emitting element of an organic electroluminescent display apparatus in which an air layer is not formed.

FIG. 6 is a view illustrating an output path of a light emitted from an organic light emitting element E of an organic electroluminescent display apparatus in which an air layer is not formed.

As shown in FIG. 6, a white light emitted from the sub-pixels R, G, and B passes through the color filter layer 180 and is output. At this time, regarding the white light passing through the R color filter, a light of a different wavelength band is absorbed and only a red light is output. Regarding the white light passing through the G color filter, a light of a different wavelength band is absorbed and only a green light is output. Regarding the white light passing through the B color filter, a light of a different wavelength band is absorbed and only a blue light is output.

However, in the organic electroluminescent display apparatus having such the structure, since a black matrix is not disposed between the R, G, and B color filters to realize a high resolution, a light passing through a specific sub-pixel may be output through other adjacent sub-pixel regions.

For example, lights ① and ③ that pass through the R, G, and B color filters vertically are output through the R, G, and B sub-pixels as they are.

The color filter layer 180 includes R, G, and B color filters having similar refractive indices, and the R, G, and B color filters are in contact with each other at the interfaces between the sub-pixels. Thus, the interfaces of the sub-pixels have substantially similar refractive indices. Accordingly, a light incident to a specific sub-pixel at a predetermined angle and incident to the interface with the adjacent sub-pixel is output through the adjacent sub-pixel as it is without refraction.

For example, a light ② input to the R color filter at a certain angle is incident on the interface between the R sub-pixel and the G sub-pixel, and the incident light is directly input to the G sub-pixel without refraction or reflection. Thus, not all of the light output from the R sub-pixel is output from the R sub-pixel, but some light is output through the adjacent G sub-pixel. Accordingly, a mixture of different colors of red light and green light is generated in the G sub-pixel, so that a spot due to a light leakage is generated on a screen.

Figure 7:
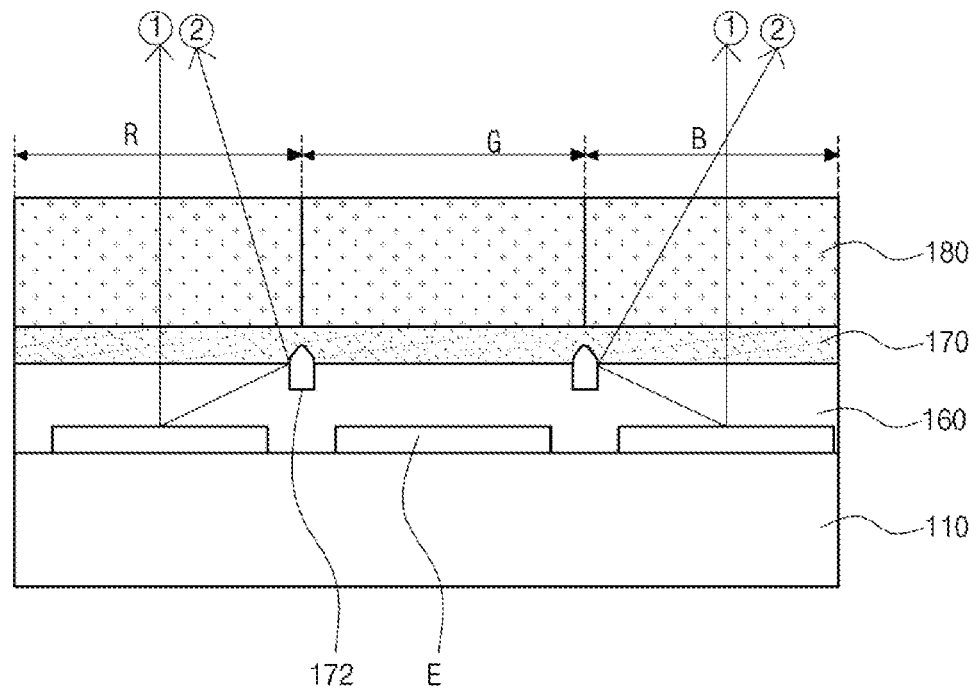
FIG. 7 is a view illustrating an output path of a light emitted from an organic light emitting element of an organic electroluminescent display apparatus according to the first aspect of the present disclosure.

FIG. 7 is a view illustrating an output path of a light emitted from an organic light emitting element of an organic electroluminescent display apparatus according to the first aspect of the present disclosure.

As shown in FIG. 7, in the organic electroluminescent display apparatus 100 according to the first aspect of the present disclosure, the color filter layer 180 is formed on the R, G, and B sub-pixels, and the air layer 172 is formed in the encapsulation layer 160 and the second inter-layered insulating layer 170 at the boundary regions between the R, G, and B sub-pixels. In this regard, it can be seen that the air layer 172 divides the encapsulation layer 160 and the second interlayer insulating layer 170 by the R, G, and B sub-pixels.

In this case, the air layer 172 may be formed in a band shape elongated along a thickness direction of the encapsulation layer 160 and the second inter-layered insulating layer 170, but is not limited thereto.

In the organic electroluminescent display apparatus 100 having such the structure, a white light emitted from the organic light emitting element E of the R, G, and B sub-pixels propagates through the encapsulation layer 160 and the second inter-layered insulating layer 170 and then is output through the color filter layer 180 thereon. For example, the white light emitted from the organic light emitting element E of the R sub-pixel propagates through the encapsulation layer 160 and the second inter-layered insulating layer 170, and then passes through the R color filter while a light in a different wavelength band is absorbed, so that only a red light is output. The white light emitted from the organic light emitting element E of the B sub-pixel propagates through the encapsulation layer 160 and the second inter-layered insulating layer 170, and then passes through the B color filter while a light in a different wavelength band is absorbed, so that only a blue light is output. The white light emitted from the organic light emitting element E of the G sub-pixel propagates through the encapsulation layer 160 and the second inter-layered insulating layer 170, and then passes through the G color filter while a light in a different wavelength band is absorbed, so that only a green light is output.

A Light ① emitted from the organic light emitting element E of the sub-pixel and output vertically upward propagates through the encapsulation layer 160 and the second inter-layered insulating layer 170 and then is output through the corresponding color filter.

A Light ② emitted from the organic light emitting element E of the sub-pixel and output upward at a predetermined angle propagates toward the interface with the adjacent sub-pixel in the encapsulation layer 160 and the second inter-layered insulating layer 170. However, the air layer 172 is formed in the encapsulation layer 160 and the second inter-layered insulating layer 170 in the boundary region between the sub-pixels. Thus, due to a difference in refractive index between the encapsulation layer 160 and the second inter-layered insulating layer 170, and the air layer 172, the light propagating to the adjacent sub-pixel in the encapsulation layer 160 and the second interlayer insulating layer 170 does not propagate to the sub-pixel but is reflected at the interface. In other words, the light propagating to the interface with the sub-pixel propagates through the encapsulation layer 160 and the second inter-layered insulating layer 170 of the corresponding sub-pixel by reflection, and then is output through the corresponding color filter layer 180.

Accordingly, in the organic electroluminescent display apparatus 100 according to the first aspect of the present disclosure, the light emitted from the organic light emitting element E of the corresponding sub-pixel does not penetrate into the adjacent sub-pixel, but is all output through the corresponding color filter. Thus, defects caused by color mixing with the adjacent sub-pixel are prevented, and a luminance in the corresponding sub-pixel is significantly increased.

Figure 8A:
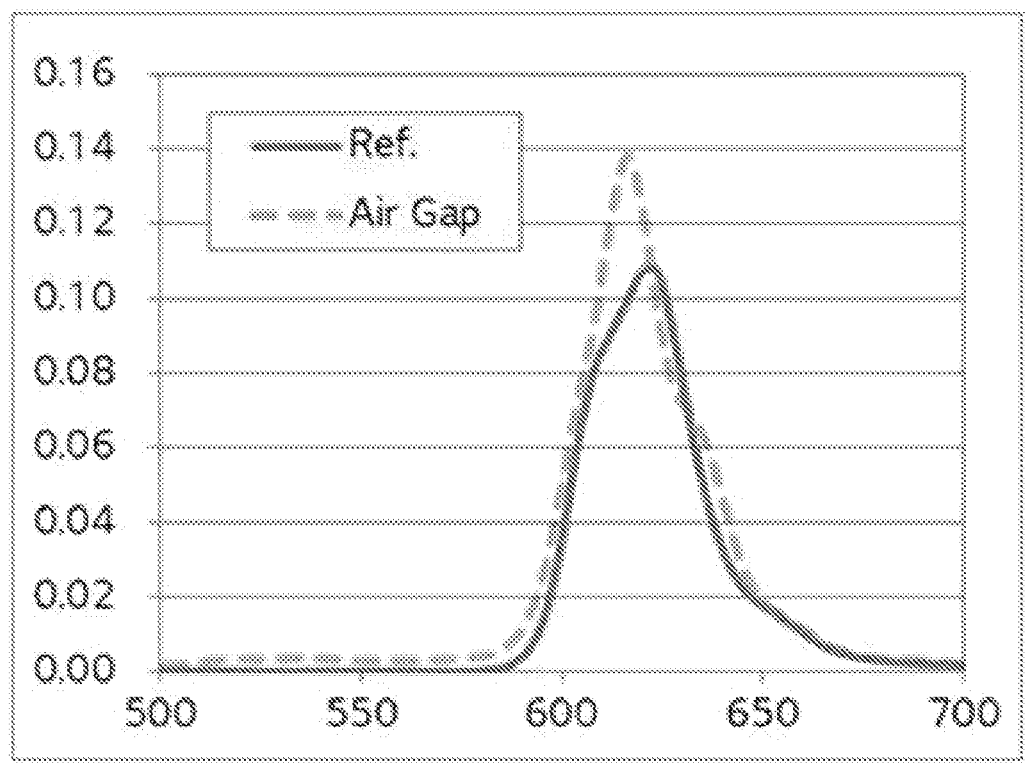
FIGS. 8A to 8C are views showing luminance of R, G, and B sub-pixels, respectively, in an organic electroluminescent display apparatus without an air layer and in an organic electroluminescent display apparatus with an air layer according to the first aspect of the present disclosure.
Figure 8B:
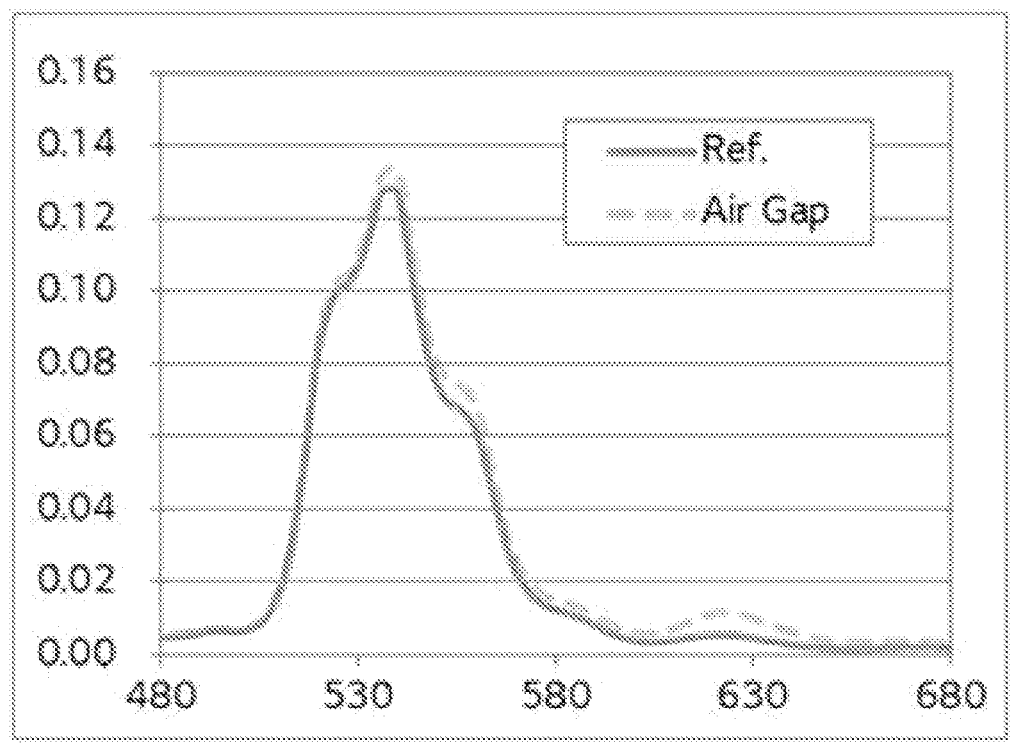
Figure 8C:
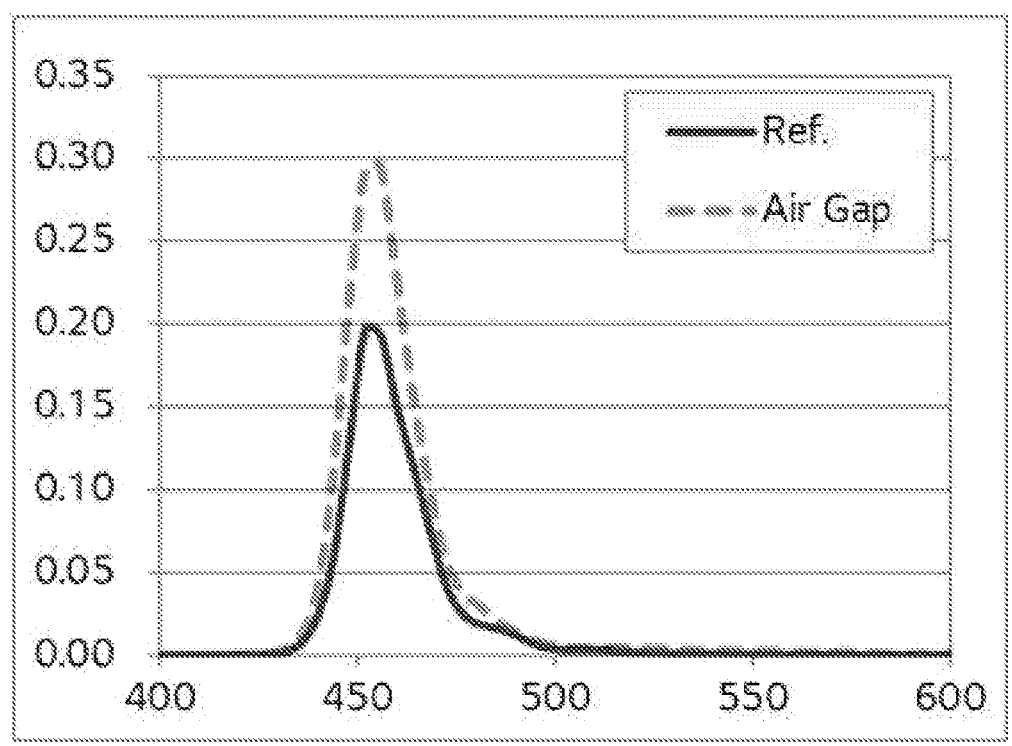

FIGS. 8A to 8C are views showing luminance of R, G, and B sub-pixels, respectively, in an organic electroluminescent display apparatus without an air layer and in an organic electroluminescent display apparatus with an air layer according to the first aspect of the present disclosure. In the drawings, a solid line (Ref) indicates a luminance when an air layer is not provided, and a dotted line (air gap) indicates a luminance of the organic electroluminescent display apparatus according to the first aspect of the present disclosure.

As shown in FIG. 8A, when an air layer is not provided, a luminance of a red light output through a R sub-pixel is about 0.11, whereas when the air layer 172 is provided, a luminance of a red light output through a R sub-pixel increases to about 0.14.

As shown in FIG. 8B, when an air layer is not provided, a luminance of a green light output through a G sub-pixel is about 0.13, whereas when the air layer 172 is provided, a luminance of a green light output through a G sub-pixel increases to about 0.136.

As shown in 8C, when an air layer is not provided, a luminance of a blue light output through a B sub-pixel is about 0.20, whereas when the air layer 172 is provided, a luminance of a blue light output through a B sub-pixel increases to about 0.30.

As described above, in the organic electroluminescent display apparatus 100 according to the first aspect of the present disclosure, lights output from the organic light emitting elements E of the R, G and B sub-pixels and incident to the interfaces with the R, G and B sub-pixels are totally reflected and then are again output through the R, G and B sub-pixels, so the luminance of the R, G and B sub-pixels are greatly improved.

FIGS. 9A to 9G are views illustrating a method of manufacturing an organic electroluminescent display apparatus according to the first aspect of the present disclosure.

Figure 9A:
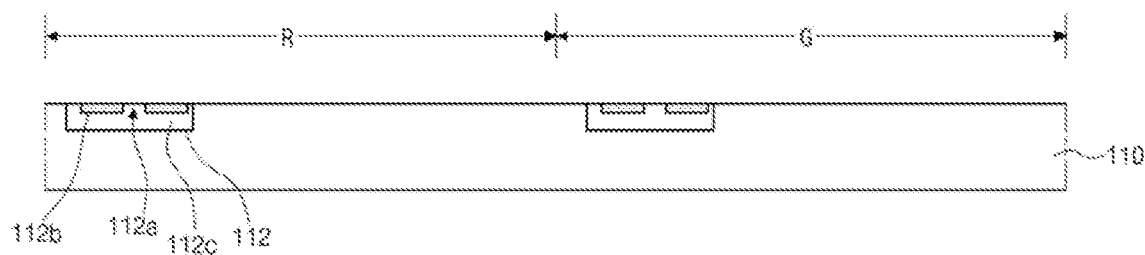
FIGS. 9A to 9G are views illustrating a method of manufacturing an organic electroluminescent display apparatus according to the first aspect of the present disclosure.

First, as shown in FIG. 9A, after preparing a wafer substrate 110 formed by growing a single crystal semiconductor material such as single crystal silicon, impurities are doped into each sub-pixel of the wafer substrate 110. By doping with these impurities, an active region 112 including a source region 112b, a drain region 112c, and a central channel region 112a undoped with impurities may be formed in the wafer substrate 110.

Figure 9B:
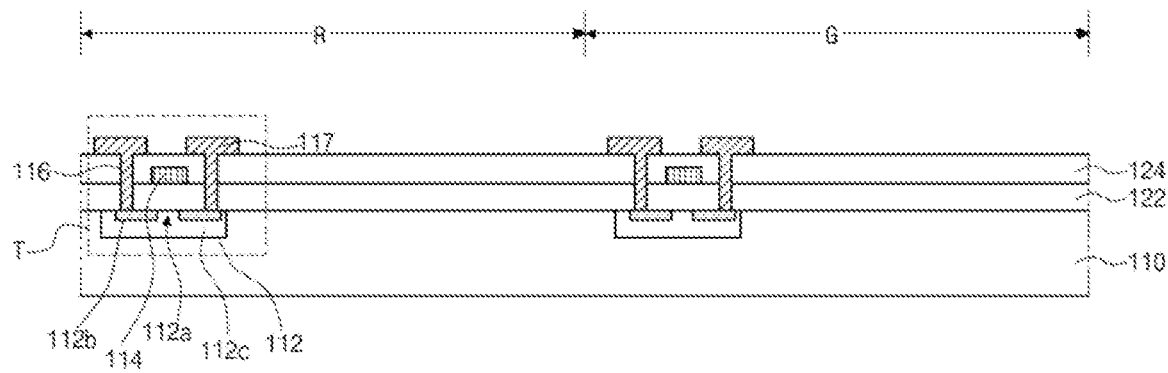

Subsequently, as shown in FIG. 9B, a gate insulating layer 122 may be formed by laminating an inorganic material such as SiOx or SiNx as a single layer or a plurality of layers by a CVD (Chemical Vapor Deposition) method. Then, a metal may be deposited on the gate insulating layer 122 and be etched to form a gate electrode 114.

Thereafter, an inorganic material may be laminated to form an inter-layered insulating layer 124 of a single layer or a plurality of layers. Then, a metal may be laminated and etched to form a source electrode 116 and a drain electrode 117 electrically connected to the source region 112b and the drain region 112c of the active region 112 through respective contact holes. Accordingly, the transistor T may be completed.

Figure 9C:
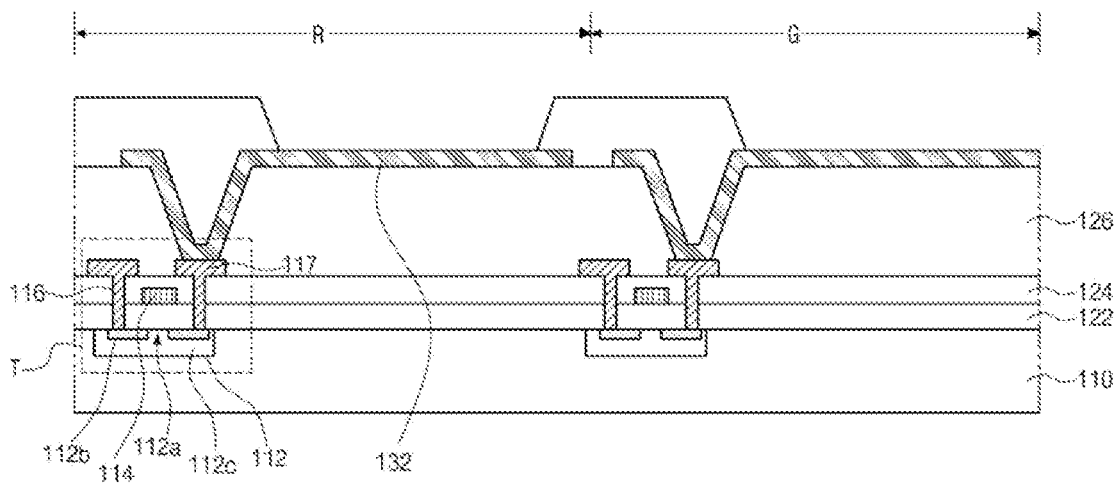

Subsequently, as shown in FIG. 9C, a passivation layer 126 may be formed by laminating an organic material or laminating an inorganic material and an organic material on the transistor T. Then, a transparent conductive material such as ITO and IZO, or a metal may be laminated and etched to form a first electrode 132 in each sub-pixel. At this time, although not shown in the drawings, when the first electrode 132 is formed of a transparent conductive material, a metal having a good reflectance such as Al or Ag may be laminated on the passivation layer 126 to form a reflective electrode before the first electrode 132 is formed and etched.

Figure 9D:
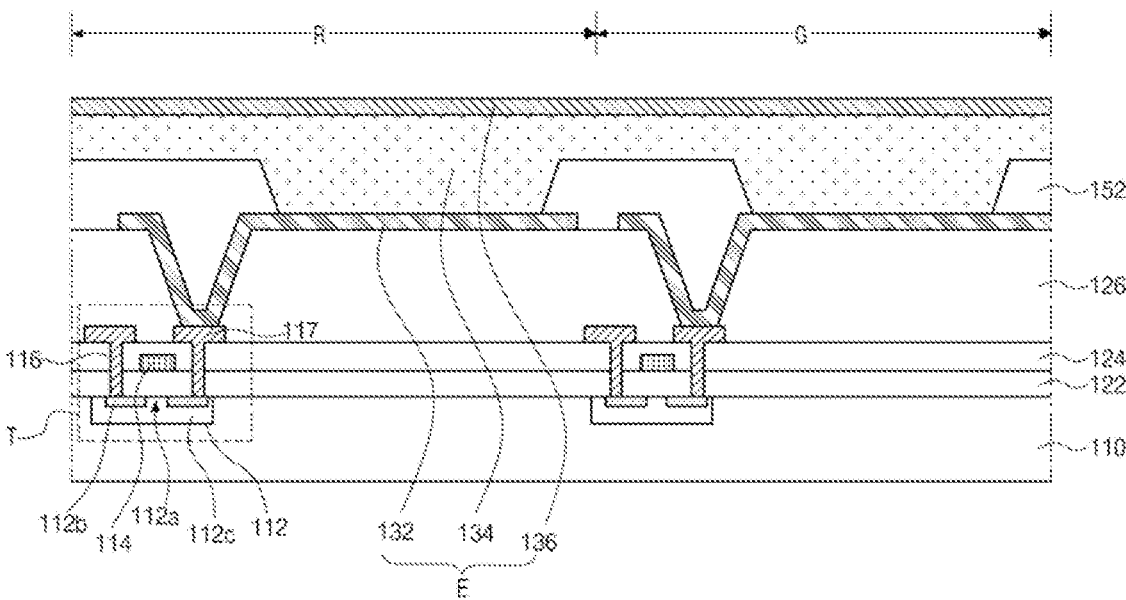

Thereafter, the bank layer 152 may be formed on the passivation layer 126 on which the first electrode 132 is formed. Then, as shown in FIG. 9D, an organic light emitting material may be coated over the entire wafer substrate 110 to form an organic light emitting layer 134.

Next, a second electrode 136 may be formed by laminating a transparent conductive material such as ITO or IZO entirely over the organic light emitting layer 134 in a sputtering method.

Figure 9E:
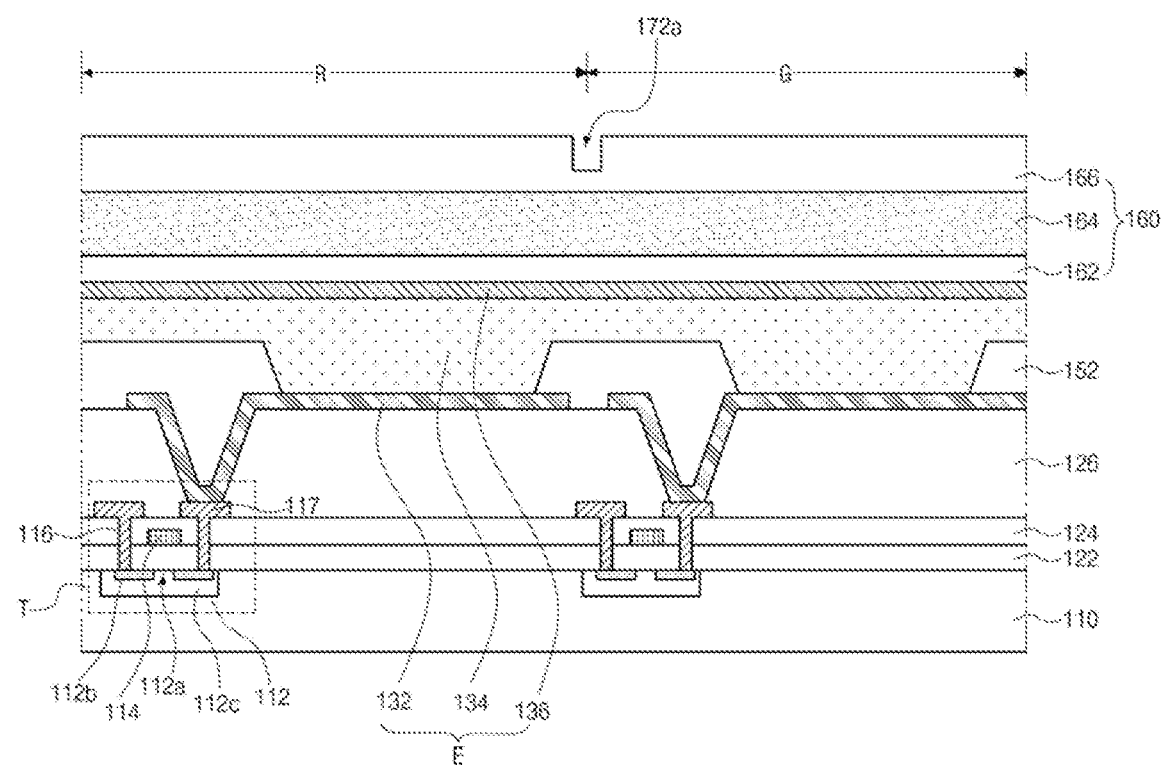

Subsequently, as shown in FIG. 9E, an encapsulation layer 160 may be formed on the second electrode 136. The encapsulation layer 160 may include a first encapsulation layer 162, a second encapsulation layer 164, and a third encapsulation layer 166. The first encapsulation layer 162 may be formed by laminating an inorganic material such as SiOx or SiNx by a CVD method. The second encapsulation layer 164 may be formed by coating an organic material such as polyethylene terephthalate, polyethylene naphthalate, polycarbonate, polyimide, polyethylene sulfonate, polyoxymethylene, or polyarylate. The third encapsulation layer 166 may be formed by laminating an inorganic material such as SiNx and SiOx by a CVD method.

Thereafter, the third encapsulation layer 166 may be etched to form an opening 172a in a boundary region between the sub-pixels.

Figure 9F:
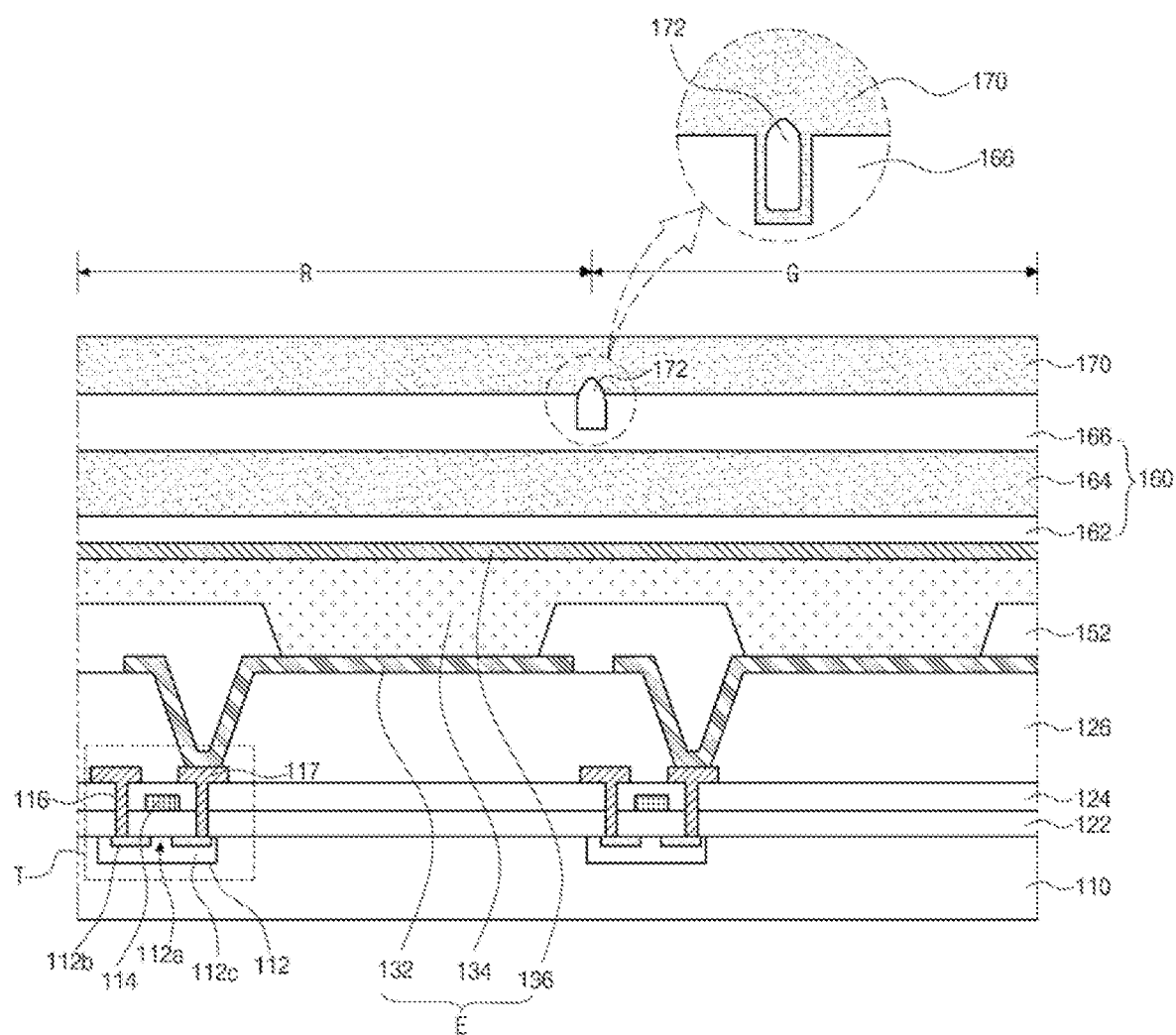

Next, as shown in FIG. 9F, an inorganic material such as SiOx, SiNx, or SiON may be laminated on the third encapsulation layer 166 by a CVD method to form a second inter-layered insulating layer 170.

When the second interlayer insulating layer 170 is formed by the CVD method, the insulating material is most deposited on an overhang of the opening 172a, is the second most deposited on a bottom of the opening 172a, and is the least deposited on a side of the opening 172a. Accordingly, as the CVD process proceeds, an empty space in which an inorganic material is not deposited is generated inside the opening 172a, and the empty space is formed as the air layer 172.

In this case, when a width of the opening 172a exceeds 1 μm, SiOx or SiNx is deposited therein, so that an air layer does not be formed inside the opening 172a. Therefore, the opening 172a may have the width of 1 μm or less. In addition, the width and depth of the opening 172a may be formed in a ratio of 1:1.

Figure 9G:
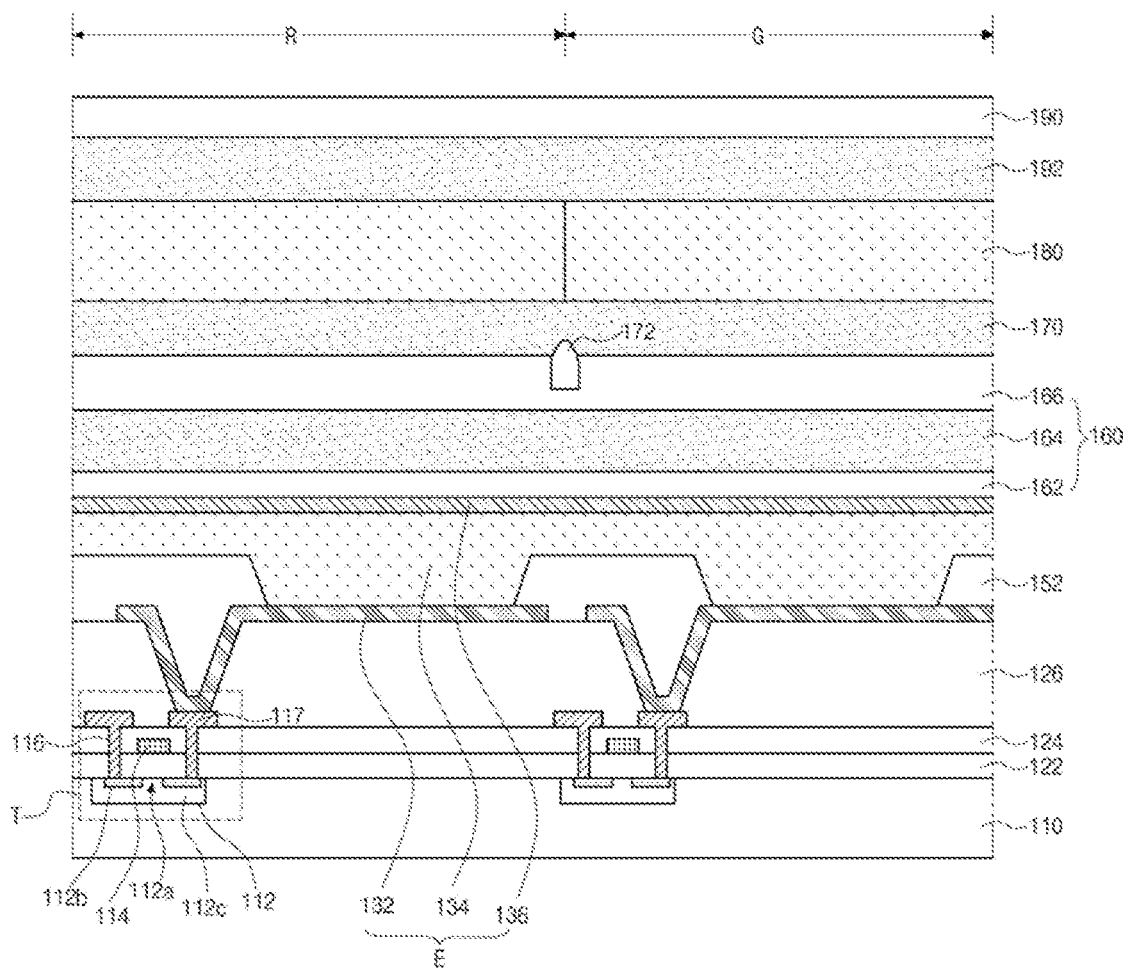

Next, as shown in FIG. 9G, a color filter layer 180 may be formed on the second inter-layered insulating layer 170. Then, a protective member 190 may be attached to the color filter layer 180 with an adhesive 192 such as OCA. Accordingly, the organic electroluminescent display apparatus 100 is manufactured.

As described above, in the organic electroluminescent display apparatus 100 according to the first aspect of the present disclosure, the air layer 172 is formed in the boundary region between the sub-pixels below the color filter layer 180. Therefore, penetration of a light into the color filter layer 180 can be prevented, and an intensity of a light incident to the color filter layer 180 of the corresponding sub-pixel can be increased.

Figure 10:
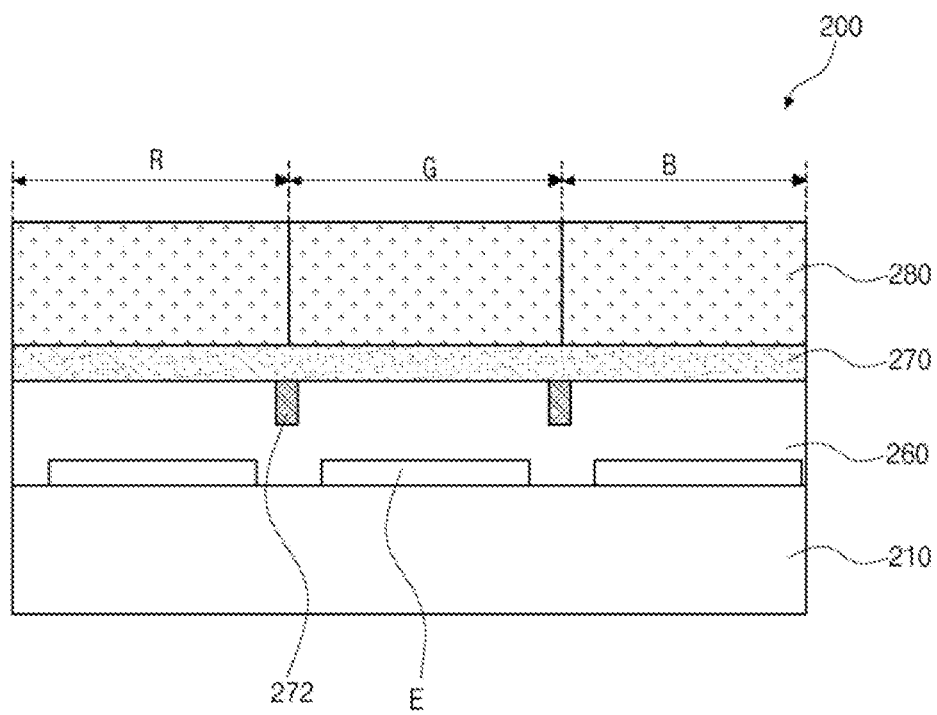
FIG. 10 is a view schematically illustrating a reflective member of an organic electroluminescent display apparatus according to a second aspect of the present disclosure.

FIG. 10 is a view schematically illustrating a reflective member of an organic electroluminescent display apparatus according to a second aspect of the present disclosure. In this case, since the organic electroluminescent display apparatus 200 of this aspect has substantially the same structure as the organic electroluminescent display apparatus 100 according to the first aspect except for the reflective member 272, the same structure is omitted from the drawings, and the structure of the reflective member 272 is mainly illustrated.

As shown in FIG. 10, in the organic electroluminescent display apparatus 200 according to the second aspect of the present disclosure, an organic light emitting element E may be formed on a wafer substrate 210, and an encapsulation layer 260 may be formed on the organic light emitting element E. An inter-layered insulating layer 270 may be formed on the encapsulation layer 260, and a color filter layer 280 may be formed on the inter-layered insulating layer 270.

Although not shown in the drawings, the organic light emitting element E may include a first electrode disposed in each R, G, and B sub-pixel, an organic light emitting layer formed on the first electrode and over the entire wafer substrate 210, and a second electrode formed on the organic light emitting layer over the entire wafer substrate 210.

The color filter layer 280 may include R, G, and B color filters respectively formed in the R, G, and B sub-pixels.

Although not shown in the drawings, the encapsulation layer 260 may include a first encapsulation layer made of an inorganic material, a second encapsulation layer made of an organic material and formed on the first encapsulation layer, and a third encapsulation layer made of an inorganic material and formed on the second encapsulation layer.

A reflective member 272 may be formed in a boundary region between the sub-pixels inside the encapsulation layer 260. The reflective member 272 may conduct the same function as the air layer 172 of the first aspect. That is, the reflective member 272 may reflect a light emitted from the organic light emitting element E and propagated to the adjacent sub-pixel to output it through the corresponding sub-pixel, thereby preventing defects due to color mixing between adjacent sub-pixels and improving a luminance of the organic electroluminescent display apparatus 200.

The reflective member 272 is formed by filling an opening formed in the encapsulation layer 260 with a material having a lower refractive index than that of the encapsulation layer 260.

When the encapsulation layer 260 is formed with a first inorganic encapsulation layer, a second organic encapsulation layer, and a third inorganic encapsulation layer, the reflective member 272 may be formed inside the third inorganic encapsulation layer and may be made of a material having a lower refractive index than that of SiOx or SiNx forming the third inorganic encapsulation layer.

When the encapsulation layer 260 is formed with the first inorganic encapsulation layer and the second organic encapsulation layer, the reflective member 272 may be formed inside the second organic encapsulation layer, and may be made of a material having a lower refractive index than the organic material.

As described above, instead of the air layer, the reflective member 272 is formed of a material having a lower refractive index than the material forming the encapsulation layer. Thus, a degree of freedom in a process of forming the reflective member 272 increases. Accordingly, the reflective member 272 can be formed only in the encapsulation layer 260 and not in the inter-layered insulating layer 270, and the reflective member 272 can have various shapes.

Figure 11A:
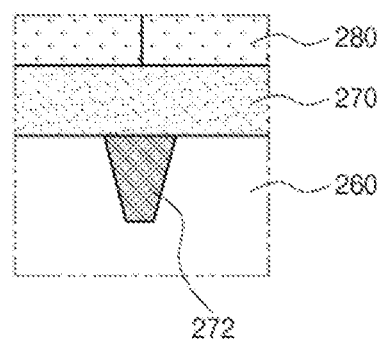
FIGS. 11A and 11B are views illustrating other structures of an organic electroluminescent display apparatus according to the second aspect of the present disclosure.
Figure 11B:
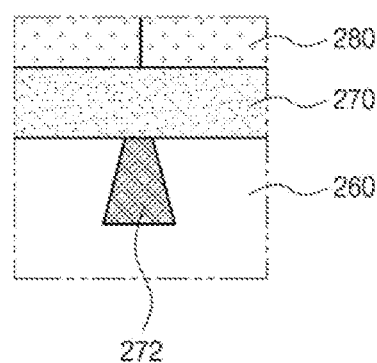

For example, as shown in FIG. 11A, the reflective member 272 may be formed to become narrower in width from a top to a bottom. Alternatively, as shown in FIG. 11B, the reflective member 272 may be formed to become wider in width from a top to a bottom.

In addition to this structure, the reflective member 272 may be formed in various shapes. The shape of the reflective member 272 may be variously modified according to the structure of the organic electroluminescent display apparatus 200.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
a substrate including a plurality of sub-pixels;
a transistor formed in each of the plurality of sub-pixels;
an organic light emitting element formed in each of the plurality of sub-pixels;
an encapsulation layer formed on the organic light emitting element;
a reflective member disposed in a boundary region between the plurality of sub-pixels and formed inside the encapsulation layer; and
a color filter layer disposed on the encapsulation layer, wherein the reflective member is an air layer.

2. The display apparatus of claim 1, wherein the substrate includes a semiconductor wafer.

3. The display apparatus of claim 2, wherein the transistor includes:
an active region formed inside the semiconductor wafer;
a gate insulating layer formed on the semiconductor wafer;
a gate electrode formed on the gate insulating layer;
a first inter-layered insulating layer formed on the gate electrode; and
a source electrode and a drain electrode formed on the first inter-layered insulating layer.

4. The display apparatus of claim 1, wherein the encapsulation layer includes:
a first encapsulation layer made of an inorganic material;
a second encapsulation layer made of an organic material and formed on the first encapsulation layer; and
a third encapsulation layer made of an inorganic material and formed on the second encapsulation layer.

5. The display apparatus of claim 4, wherein the air layer is formed in the third encapsulation layer.

6. The display apparatus of claim 5, further comprising a second inter-layered insulating layer formed on the third encapsulation layer.

7. The display apparatus of claim 6, wherein the air layer extends into the second inter-layered insulating layer.

8. The display apparatus of claim 7, wherein the air layer is formed in a band shape elongated along a thickness direction of the encapsulation layer and the second inter-layered insulating layer.

9. The display apparatus of claim 6, wherein the air layer is formed only in the third encapsulation layer and not in the second inter-layered insulating layer.

10. The display apparatus of claim 9, wherein the air layer is formed to become narrower or become wider in width from a top to a bottom.

11. The display apparatus of claim 4, wherein a material having a lower refractive index than that of third encapsulation layer is filled in the air layer.

12. The display apparatus of claim 1, wherein the encapsulation layer includes:
a first encapsulation layer made of an inorganic material; and
a second encapsulation layer made of an organic material and formed on the first encapsulation layer.

13. The display apparatus of claim 12, wherein the air layer is formed in the second encapsulation layer.

14. The display apparatus of claim 1, wherein the organic light emitting element includes:
a first electrode;
an organic light emitting layer disposed on the first electrode; and
a second electrode disposed on the organic light emitting layer.

15. The display apparatus of claim 14, wherein the organic light emitting layer emits white light.

16. The display apparatus of claim 14, further comprising a bank layer covering both ends of the first electrode,
wherein the reflective member is disposed at a position overlapping with the bank layer.

17. The display apparatus of claim 1, wherein the plurality of the sub-pixels includes red, green and blue sub-pixels.

18. The display apparatus of claim 1, wherein the air layer reflects a light emitted from the organic light emitting element and propagated to an adjacent sub-pixel to output it through a corresponding sub-pixel.

19. The display apparatus of claim 1, further comprising an adhesive disposed on the color filter layer and a protective member disposed on the adhesive,
wherein the protective member is attached to the color filter layer by the adhesive.

* * * * *